(12) United States Patent
Miyazaki

(10) Patent No.: US 8,504,137 B2
(45) Date of Patent: Aug. 6, 2013

(54) MAGNETIC RESONANCE IMAGING APPARATUS AND MAGNETIC RESONANCE IMAGING METHOD

(75) Inventor: Mitsue Miyazaki, Mount Prospect, IL (US)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 31 days.

(21) Appl. No.: 13/352,781

(22) Filed: Jan. 18, 2012

(65) Prior Publication Data

US 2012/0116207 A1    May 10, 2012

Related U.S. Application Data

(63) Continuation-in-part of application No. 12/926,270, filed on Nov. 5, 2010.

(30) Foreign Application Priority Data

Oct. 11, 2011   (JP) ................................ 2011-223599

(51) Int. Cl.
   *A61B 5/05*   (2006.01)
(52) U.S. Cl.
   USPC .......................................... 600/410; 600/411
(58) Field of Classification Search
   USPC ................................................. 600/407–430
   See application file for complete search history.

(56) References Cited

U.S. PATENT DOCUMENTS

| | | | |
|---|---|---|---|
| 6,246,897 B1 * | 6/2001 | Foo et al. | 600/413 |
| 6,801,800 B2 * | 10/2004 | Miyazaki et al. | 600/410 |
| 7,693,563 B2 * | 4/2010 | Suresh et al. | 600/407 |
| 2002/0032376 A1 * | 3/2002 | Miyazaki et al. | 600/410 |
| 2004/0153128 A1 * | 8/2004 | Suresh et al. | 607/14 |
| 2007/0014452 A1 * | 1/2007 | Suresh et al. | 382/128 |
| 2010/0145182 A1 | 6/2010 | Schmidt et al. | |
| 2012/0172701 A1 | 7/2012 | Holthulzen et al. | |

FOREIGN PATENT DOCUMENTS

JP   2009-148463   7/2009

OTHER PUBLICATIONS

Ono, et al., "Deep vein thrombosis using non-contrast-enhanced MR venography with electro-cardiographically-gated three-dimensional half-Fourier FSE: preliminary experience," MRM, vol. 61, pp. 907-917 (2009).
Office Action dated Oct. 9, 2012 in U.S. Appl. No. 12/926,270, Miyazaki.
European Search Report re EP 11 187 926.8 dated Mar. 1, 2012.
Mitsue Miyazaki, et al., "Nonenhanced MR Angiography," *Radiology*, vol. 248, No. 1, pp. 20-43 (Jul. 2008).

* cited by examiner

*Primary Examiner* — Sanjay Cattungal
(74) *Attorney, Agent, or Firm* — Nixon & Vanderhye PC

(57) ABSTRACT

An exemplary magnetic resonance imaging apparatus includes a scan performing unit. The scan performing unit is configured to sequentially perform plural types of scans in a predetermined sequence, i.e., a first scan, a second scan, and a third scan, to acquire image data at a target region in a patient in a predetermined sequence. The first scan is performed to acquire image data in a first phase encoding direction during diastole in the patient. The second scan is performed to acquire image data in a second phase encoding direction approximately orthogonal to the first phase encoding direction during diastole in the patient. The third scan is performed to acquire image date in the second phase encoding direction during systole in the patient.

16 Claims, 4 Drawing Sheets

MAGNETIC RESONANCE IMAGING APPARATUS AND MAGNETIC RESONANCE IMAGING METHOD

CROSS-REFERENCE TO RELATED APPLICATIONS

This application is a continuation-in-part (CIP) of application Ser. No. 12/926,270 filed Nov. 5, 2010, the entire content of which is hereby incorporated by reference in this application. This application is based upon and claims the benefit of priority from Japanese Patent Application No. 2011-223599, filed on Oct. 11, 2011, the entire contents of all of which is incorporated herein by reference.

FIELD

Embodiments described herein relate generally to a magnetic resonance imaging apparatus and a magnetic resonance imaging method.

BACKGROUND

Conventionally, a magnetic resonance venography technique (hereinafter, appropriately described as an "MRV technique") for imaging veins without contrast agents is known as one of imaging techniques implemented by a magnetic resonance imaging apparatus (hereinafter, appropriately described as an "MRI system").

DETAILED DESCRIPTION

According to one embodiment, a magnetic resonance imaging apparatus includes a scan performing unit and an image processing unit. The scan performing unit is configured to sequentially perform plural types of scans to acquire image data of images at a target region in a patient in a predetermined sequence, wherein the scans include a first scan to acquire the image data in a first phase encoding direction during diastole in the patient, a second scan to acquire the image data in a second phase encoding direction approximately orthogonal to the first phase encoding direction during diastole in the patient, and a third scan to acquire the image data in the second phase encoding direction during systole in the patient. The image processing unit is configured to perform predetermined image processing on plural image data sets acquired by the plural types of scans after the scan performing unit completes the first scan, the second scan, and the third scan.

Various Embodiments will be described hereinafter with reference to the accompanying drawings.

Figure 1:
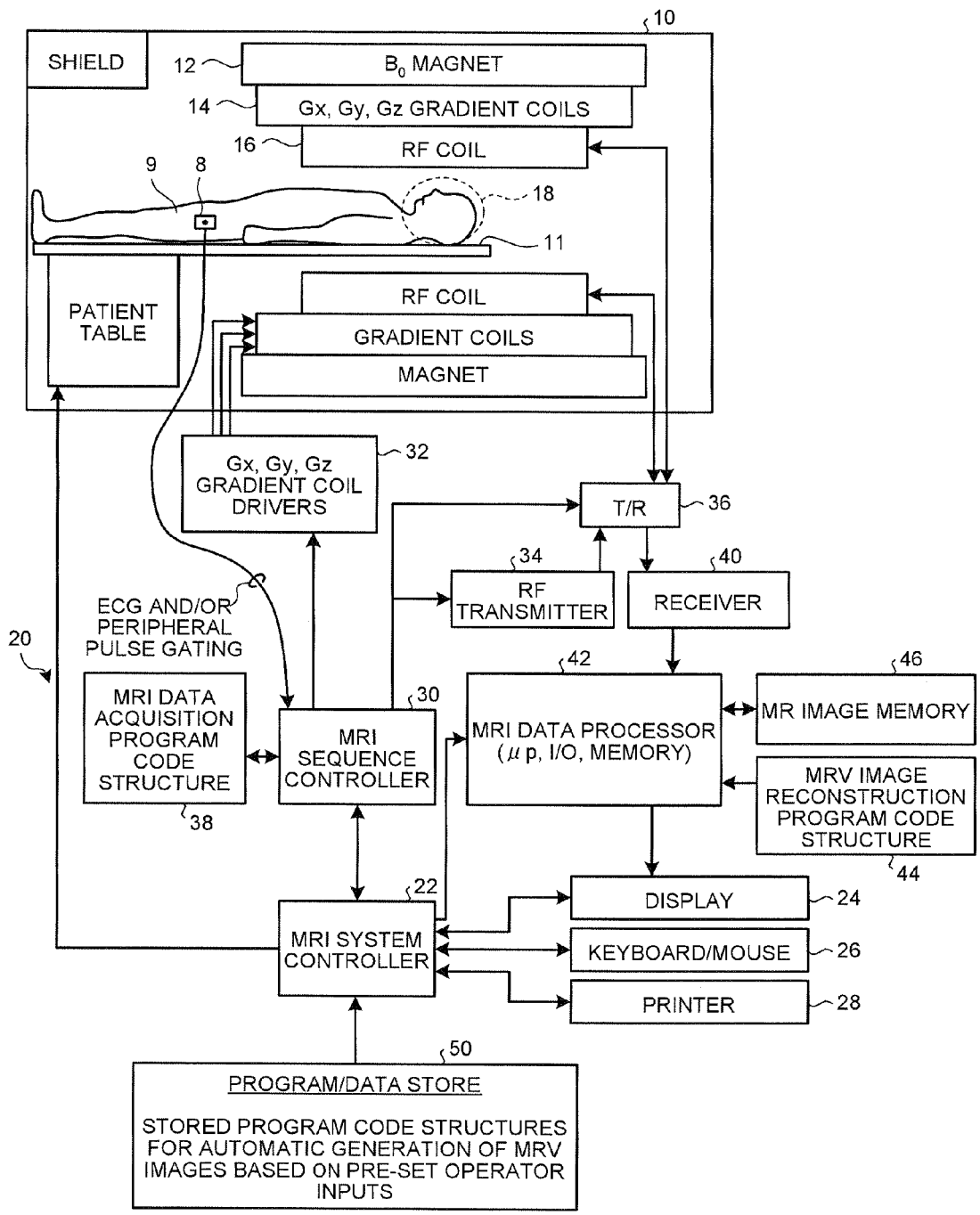
FIG. 1 is a block diagram of a configuration example of an exemplary MRI system.

The MRI system shown in FIG. 1 includes a gantry 10 (shown in schematic cross-section) and various related system components 20 interfaced therewith. At least the gantry 10 is typically located in a shielded room. One MRI system geometry depicted in FIG. 1 includes a substantially coaxial cylindrical arrangement of the static field B0 magnet 12, a $G_x$, $G_y$ and $G_z$ gradient coil set 14 and an RF coil assembly 16. Along the horizontal axis of this cylindrical array of elements is an imaging volume 18 shown as substantially encompassing the head of a patient 9 supported by a patient table 11.

An MRI system controller 22 has input/output ports connected to display 24, keyboard/mouse 26 and printer 28. As will be appreciated, the display 24 may be of the touch-screen variety so that it provides control inputs as well.

The MRI system controller 22 interfaces with MRI sequence controller 30 which, in turn, controls the $G_x$, $G_y$, and $G_z$ gradient coil drivers 32, as well as the RF transmitter 34 and the transmit/receive switch 36 (if the same RF coil is used for both transmission and reception). Suitable electrode(s) 8 affixed suitably to the patient 9 provide ECG and/or peripheral pulse gating signals to controller 22. The MRI sequence controller 30 includes suitable program code structure 38 for implementing MRI data acquisition sequences already available in the repertoire of the MRI sequence controller 30 to generate diastolic and systolic ECG or peripheral pulse gated images.

The MRI system 20 includes an RF receiver 40 providing input to data processor 42 so as to create processed image data to display 24. The MRI data processor 42 is also configured for access to image reconstruction program code structure 44 and to image memory 46 (e.g., for storing MR image data derived from processing in accordance with the exemplary embodiments and the image reconstruction program code structure 44).

Also illustrated in FIG. 1 is a generalized depiction of an MRI system program/data store 50 where stored program code structures (e.g., for automatic generation of MRV images based on preset operator inputs via a GUI) are stored in computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments to be described herein below. The system components can be divided into different logical collections of "boxes" and typically comprise numerous digital signal processors (DSP), microprocessors, special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical states of associated data storage media (e.g., bit storage sites in magnetic storage media) are transformed from one state to another during operation of such a system. For example, at the conclusion of an MR-imaging reconstruction process, an array of computer-readable accessible data value storage sites in physical non-transitory storage media will be transformed from some prior state (e.g., physical state representing all uniform "zero" values or all "one" values) to a new state wherein the physical states at groupings of the physical sites of such an array vary between minimum and maximum digital signal values to represent real world physical events and conditions (e.g., the tissues of a patient over an imaging volume space). As those in the art will appreciate, such arrays of stored digital data values represent and also constitute a physical structure—as does a particular structure of computer control program codes that, when sequentially loaded into instruction registers and executed by one or more CPUs of the MRI system 20, cause a particular sequence of operational states to occur and be transitioned through within the MRI system.

The exemplary embodiments described below provide improved ways to process data acquisitions and/or to generate and display MR-images. Specifically, the exemplary MRI system includes, for example, a scan performing unit and an image processing unit. The scan performing unit sequentially performs plural types of scans to acquire image data of images captured at a site at issue in a patient, i.e., a first scan, a second scan, and a third scan, in a predetermined sequence. The first scan is a scan to acquire image data in a first phase encoding direction during diastole in the patient. The second scan is a scan to acquire image data in a second phase encoding direction approximately orthogonal to the first phase encoding direction during diastole in the patient. The thirds scan is a scan to acquire image data in the second phase encoding direction during systole in the patient. The image processing unit performs predetermined image processing on plural image data sets acquired by the plural types of scans after the scan performing unit completes the first scan, the second scan, and the third scan.

The exemplary MRI system further includes a receiving unit. The receiving unit receives operator input of a parameter that the scan performing unit needs when the scan performing unit performs the plural types of scans and a parameter that the image processing unit needs when the image processing unit performs image processing. The scan performing unit sequentially performs the plural types of scans in accordance with the parameter that the receiving unit has received. The image processing unit performs image processing in accordance with the parameter that the receiving unit has received. The receiving unit is not necessarily provided in the MRI system.

The exemplary MRI system includes the gantry 10 and the system components 20 as will be described below. The system components 20 include at least one program (hereinafter, appropriately described as an "automated MRV module") that is configured to capture images by the automated magnetic resonance venography (MRV) technique. The scan performing unit, the image processing unit, and the receiving unit described above are constructed as, for example, the automated MRV modules and units that are controlled by the automated MRV modules. For example, the MRI system stores the automated MRV modules in a memory, and the MRI system controller 22 to be described below reads out and executes the automated MRV modules from the memory to control the units of the MRI system. The preferred exemplary embodiments are not limited to the forms described above.

Fresh blood imaging (FBI) techniques can be used in some embodiments described below. FBI is based on an electrocardiogram (ECG) gated or peripheral pulse gated (PPG) three-dimensional (3D) FASE (fast advanced spin echo) technique, where image data is acquired with suitable delay time from the gated signal (e.g., R wave) and on the basis of ECG or PPG to visualize pumped new blood from the heart. It acquires arterial and venous blood flow in a single coronal pass requiring less scan time than other magnetic resonance angiography (MRA) techniques. It also reduces sensitivity to issues like improper ECG timing, turbulent blood flow and differential blood filling that can cause contrast-based MRA to fail. Its main features are: (a) no contrast medium is required and (b) a wide range of 3D data can be acquired in a short time because imaging of the coronal and sagittal planes is possible.

A non-contrast agent magnetic resonance venography (MRV) technique using flow-spoiled (FS) fresh blood imaging (FBI) requires a double image subtraction technique wherein an arterial source or MIP image (which is a diastolic image from which a systolic image has been subtracted) is, in turn, subtracted from another diastolic image.

Especially for the iliac region, the SPADE (single-shot partial dual echo) EPI (echo planar imaging) technique is useful in acquiring three image data sets which allow separation of arteries from veins. For example, three image data acquisitions for implementing SPADE MRV may comprise:

two diastolic SPEED (swap phase encode data) data acquisitions (one with phase encoding (PE) running in the head-feet (HF) direction and one with PE running in the right-left (RL) direction); and one systolic SPEED data acquisition (with PE running in the RL direction). The SPEED technique is an imaging technique allowing for high-level visualization of blood vessels in one image, by image acquisitions with a phase encoding (PE) axis and a read out (RO) axis interchanged with each other (the phase encoding direction is rotated by 90°) meeting in the run direction of blood vessels and by subsequent superimposition of the acquired images. In addition, a superimposition process may be the MIP processing.

In other words, it is well known (e.g., see the SPADE technique) that by acquiring a plurality (e.g., three) image data sets (using suitable systolic and diastolic triggering) and then by suitably nested image subtractions (e.g., of an arterial source image from diastolic HF PE direction images) one can obtain an MRV image of veins.

However, such approaches (e.g., the SPADE technique) have required the operator to separately direct execution of the required multiple image data acquisitions and/or their interrelated and nested subtractions. For example, the operator is required to separately direct acquisitions of three image data sets by separate operations of the MRI system. For example, the operator is required to direct selection of image data to be subjected to image processing from among the acquired three image data sets and direct execution of needed subtractions by operations of the MRI system. This is not only cumbersome and error prone but also, because of the elapsed time between image data acquisitions involving separate patient scans, the possibility of unwanted patient anatomy mis-registrations between the various images due to patient movements between scans is undesirably increased.

To address such problems, the exemplary system described below automatically acquires all of the needed image data acquisition sequences substantially without intervening pauses (e.g., three immediately successive image data acquisitions when the operator elects to use the SPADE technique). Specifically, as described above, the scan performing unit sequentially performs the following scans in a predetermined sequence: the first scan to acquire a diastole image data (A) with the phase encoding running in the HF (head-feet) direction; the second scan to acquire diastole image data (B) with the phase encoding running in the RL (right-left) direction; and the third scan to acquire systole image data (C) with the phase encoding running in the RL (right-left) direction. The "sequential acquisitions" and "sequential scans" mean that the scan performing unit sequentially performs the first scan, the second scan, and the third scan in a predetermined sequence such that completion of a preceding scan triggers a start of an immediately following scan in the predetermined sequence. That is, any operations and instructions by the operator are not needed between the scans unlike the conventional systems. The first scan, the second scan, and the third scan are three-dimensional scans with data acquisitions corresponding to a predetermined slice encoding volume repeated at intervals of plural heartbeats, where slice encoding directions of the respective scans should preferably be uniform.

The exemplary scan performing unit sequentially performs at least the first scan and the second scan, each of which is the image data acquisition scan during diastole in the patient. Specifically, two image data acquisitions are performed during diastole while one image data acquisition is performed during systole, among the three image data acquisitions. To make repetition time (TR) constant insofar as possible, it is desirable to sequentially perform the image data acquisition scans that are to be performed during diastole. In the preferred exemplary embodiment, considering that the third scan is the image data acquisition scan during systole, the predetermined sequence is preferably one of the followings: a sequence of the first scan, the second scan, and the third scan; a sequence of the third scan, the first scan, and the second scan; a sequence of the second scan, the first scan, and the third scan; and a sequence of the third scan, the second scan, and the first scan.

Then, after the image data acquisition scans are completed, the required subtractions are automatically performed by the system. Specifically, as described above, the image processing unit performs predetermined image processing on the plural image data sets acquired by the plural types of scans after the scan performing unit completes the first scan, the second scan, and the third scan. The exemplary image processing unit performs, as the predetermined image processing, a subtraction between the image data (B) acquired by the second scan and the image data (C) acquired by the third scan and a subtraction between the image data (A) acquired by the first scan and the image data obtained by the subtraction between the image data (B) and the image data (C). Any operations and instructions by the operator are not needed for the subtractions unlike the conventional system.

The preferred exemplary embodiments will be described below with an example in which the image processing unit generates an MRV image as an output image through the above subtractions; however, the preferred exemplary embodiments are not limited thereto. For example, the image processing unit included in the MRI system may perform only minimal image processing on the image data acquired by the scan performing unit. Specifically, there may be a case that the image data acquired by the MRI system is sent to, for example, an image processing device other than the MRI system and this image processing device generates the MRV image through the above subtractions.

As described earlier, the exemplary MRI system includes a receiving unit configured to receive operator presets (e.g., preset operations/instructions to designate "SPADE image data processing"). Image data acquisition sequences that might be pre-selected by the operator for data acquisitions which are then used in various subtraction techniques may, for example, comprise preset operator choices listed below. The scan performing unit described above may sequentially perform scans other than the first scan, the second scan, and the third scan, in addition to sequential execution of the first scan, the second scan, and the third scan. For example, if the femoral region or the calf region other than the iliac region is at issue for the imaging, the MRI system receives designation of imaging of the femoral region or the calf region in advance and performs this imaging immediately after the sequence of the first scan, the second scan, and the third scan is completed.

SPADE (e.g., see above for image acquisition sequences and subtractions)
flow sensitive dephasing (FSD)—FBI
FSD—bSSFP (balanced steady state free precession)
flow rephasing (FR)—FBI
flow dephasing (FD)—FBI
any other sequences that allow separation of arteries from veins by subtraction(s)

For the second through sixth options noted above, the needed data acquisitions may also be selectively made during systolic and/or diastolic ECG intervals.

As explained in more detail below, the exemplary system provides, as one example of the above receiving unit, a user selective graphical user interface (GUI) for operator preselection of desired MRV procedures (e.g., see above exemplary listing). In this way, all desired image acquisition, subtraction and other related processing such as MIP (maximum intensity projection) processing can be preset by the operator. The system may then automatically proceed to efficiently effect all necessary image data acquisition sequences and subsequent data processing (e.g., subtractions) so as to not only reduce otherwise cumbersome multiple operator-controlled operations, but also to improve the timeliness and quality of the resulting MRV image (e.g., by reducing the probability of patient movement causing mis-registration of patient fluid vessels between image data acquisitions).

Figure 2:
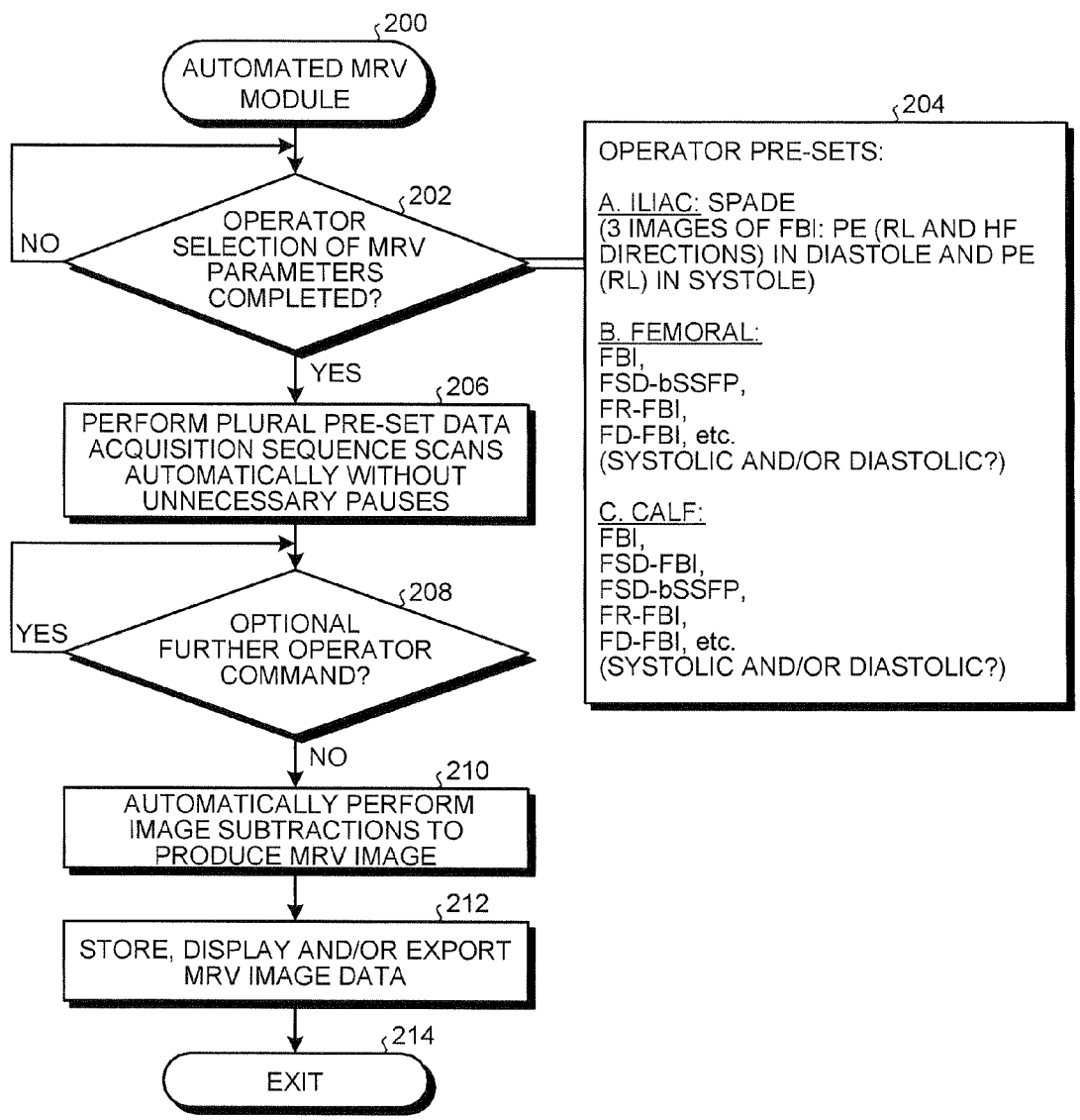
FIG. 2 is a flowchart of a processing procedure executed by the exemplary MRI system.

Referring to the exemplary program code structure depicted in FIG. 2, the automated MRV module is entered at 200 (e.g., by suitable operator and/or system transfer of program control).

At data input/wait loop 202, a test is made to see whether operator selection of MRV parameters has been completed. Exemplary operator GUI presets are depicted, for example, at box 204 in FIG. 2. Here, if the iliac region is at issue, then in the preferred exemplary embodiment, the operator will likely chose the SPADE technique described above. On the other hand, if the femoral anatomy is at issue, then the operator may be given other choices as well such as described above and also depicted at box 204 in FIG. 2. Similarly, if the calf anatomy region is at issue, then the same or other MRV parameters may be made available for operator presets. As those in the art will appreciate, this listing of possible operator presets for MRV parameters is merely illustrative and is not intended to be exhaustive or limiting in any respect.

After the preset MRV parameters have been completely entered, loop 202 transfers control to box 206 in FIG. 2. Here, the MRI system proceeds to perform plural preset MRI data acquisition sequence scans automatically and without unnecessary time delays or pauses therebetween (e.g., so as to minimize the risk of patient movement causing blood vessel misalignment between the successively taken images). In essence, the images are taken "simultaneously" insofar as possible in the preferred embodiment.

Although control can pass directly and automatically from box 206 to box 210, it is also possible to interpose an optional operator command at 208 after the plural data acquisition scans have been completed at 206. In any event, box 210 is subsequently entered where the necessary image subtractions are automatically performed to produce the desired MRV image (i.e., in accordance with the operator presets). Thereafter, the MRV image data is stored, displayed and/or exported to some remote system/site or the like at box 212 before exit from this module is taken at 214.

Figure 3:
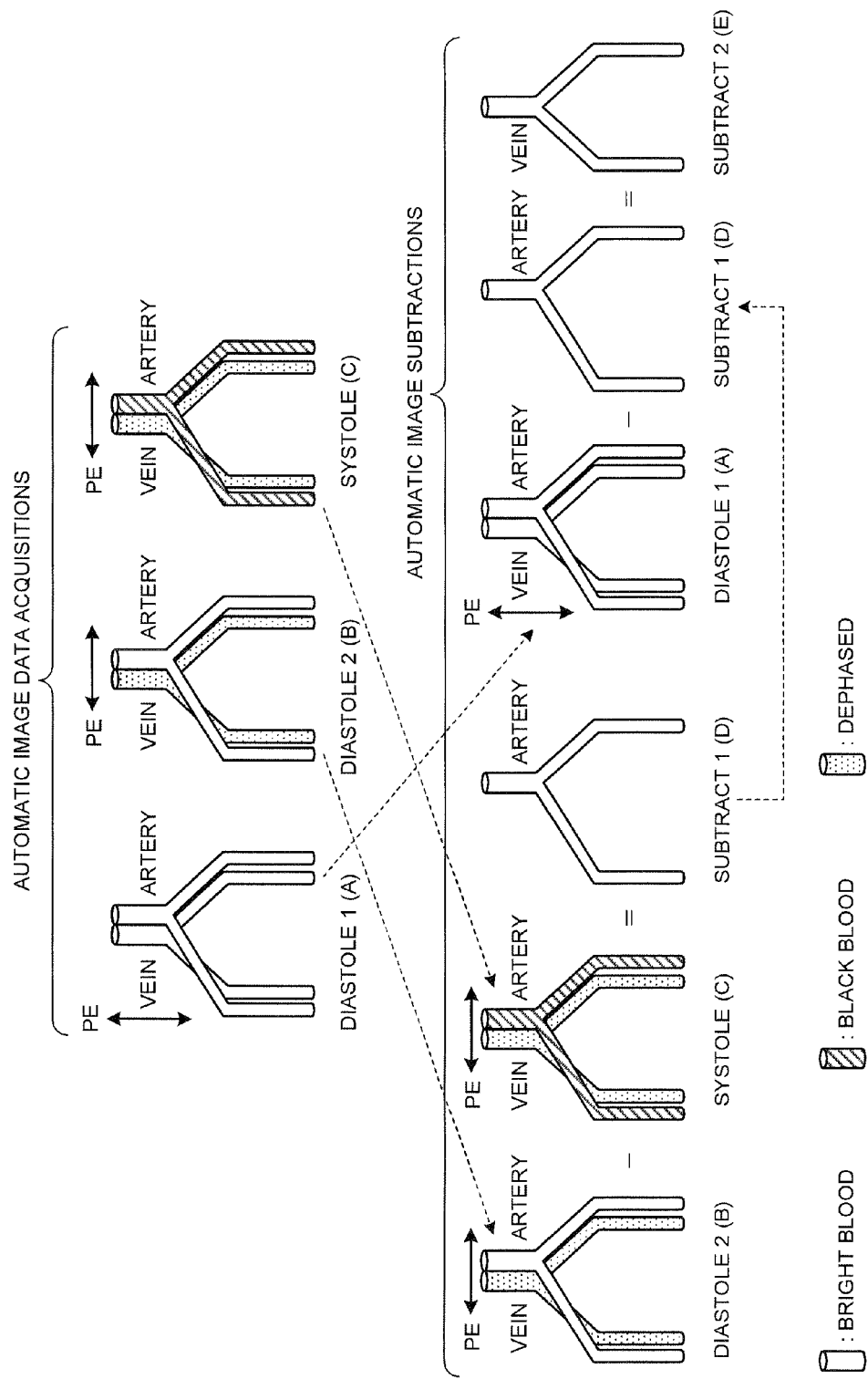
FIG. 3 schematically depicts an exemplary set of data acquisition processes and automatic subtraction processes corresponding to operator preset for single-shot partial dual echo (SPADE) data processing.

FIG. 3 schematically depicts an exemplary set of data acquisition processes and automatic subtraction processes corresponding to the operator preset for SPADE data processing. As depicted in FIG. 3, the automatic data acquisition first occurs for a Diastole1 (A) image, a Diastole2 (B) image and a Systole (C) image. The Systole (C) image is then subtracted from the Diastole2 (B) image to produce an arterial image that is subsequently then subtracted from the Diastole1 (A) image to produce the desired Subtract2 (E) output MRV image data set.

Data acquisition for the SPADE technique (e.g., as preferred for the iliac region) involves at lest three (3) data set acquisition scans. For example, the MRI system performs three types of scans, i.e., a scan to acquire image data with the phase encoding running in the HF (head-feet) direction during diastole, a scan to acquire image data with the phase encoding running in the RL (right-left) direction during diastole, and a scan to acquire image data with the phase encoding running in the RL (right-left) direction during systole. Data acquisition for other areas (e.g., for the femoral and calf regions) may involve: FBI, FED-FBI, FSD-bSSFP, FR-FBI, or FD-FBI, etc possible selections (the above is by way of example only; further selections are possible for using only systolic images and/or using both systolic and diastolic image data acquisitions). Data acquisitions for the SPADE technique involves: subtracted image (A) of systolic (PE=RL) from diastolic (PE=RL) images and further subtraction of the subtracted image (A) from the diastolic (PE=HF), followed by MIP (maximum image projection) processing.

For other MRV techniques, such as FBI, FD-FBI or FSD-FBI, etc. the processing may involve: subtraction for both systolic and diastolic acquisitions, followed by MIP (of if only systolic images are used, only MIP processing may be required or desired).

In the preferred exemplary embodiment, a GUI for MRV is provided, wherein:

1. The system acquires all required image data acquisition sequences "simultaneously" (i.e., without unnecessary delays or pauses when acquiring image data for the SPADE selection).

2. After the image data acquisitions, all required subtractions are automatically performed by the system in accordance with operator pre-selections (e.g., as a pre-selection for the SPADE image data processing).

3. The image sequences involved could be FD-FBI, Flow-sensitive dephasing (FSD)-FBI, FSD-bSSFP, and/or any other sequences that allow separation of arteries from veins in output MRV images.

The exemplary user selective GUI permits operator selection of SPADE, FS-FBI, FSD-FBI and FSD-bSSFP, etc. Thereafter, all subtraction and/or MIP processing steps are preset and automatically processed.

Figure 4:
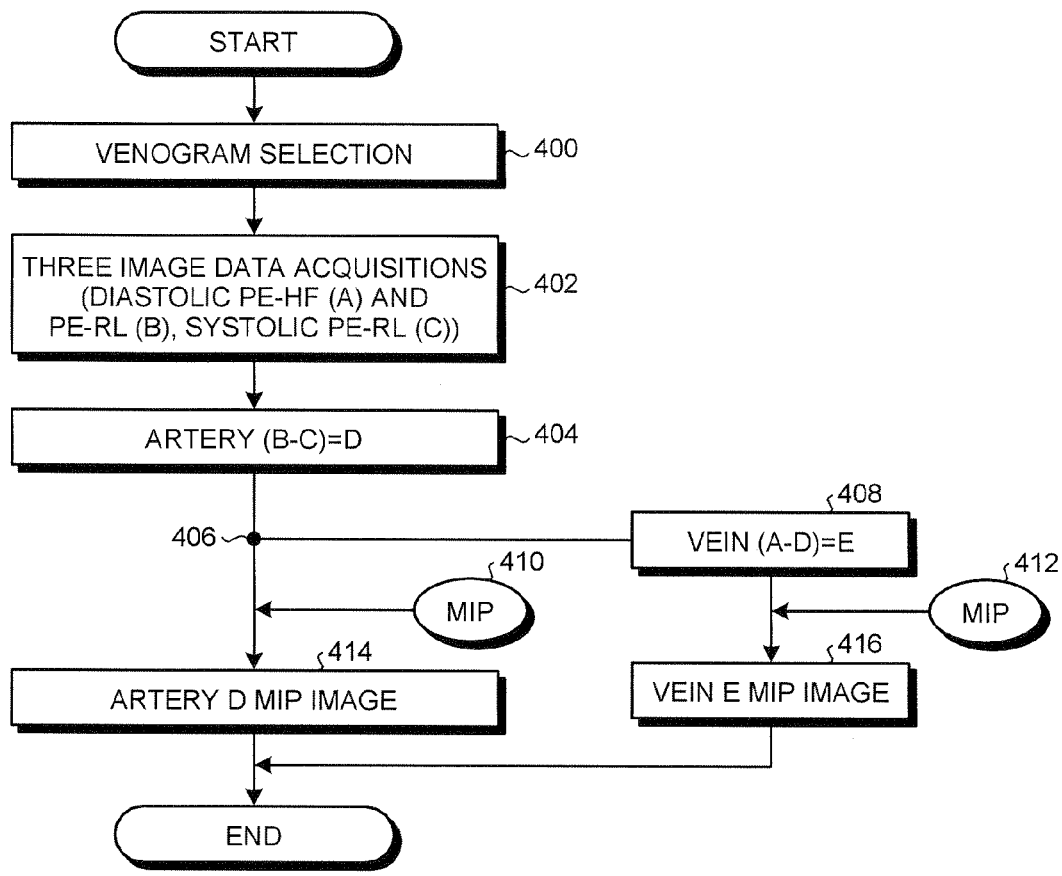
FIG. 4 is a schematic illustration of an alternate embodiment.

An alternate embodiment is depicted at FIG. 4 were venogram selection can result in output images of either arteries or veins. After the routine is entered at box 400 (e.g., with an operator input selection for output artery images or vein images), then the three SPADE image data acquisitions are executed at 402. For example, the MRI system sequentially performs three types of scans, i.e., the first scan to acquire the image data (A) with the phase encoding running in the HF (head-feet) direction during diastole, the second scan to acquire the image data (B) with the phase encoding running in the RL (right-left) direction during diastole, the third scan to acquire the image data (C) with the phase encoding running in the RL (right-left) direction during systole. Thereafter, the MRI system subtracts the image data (C) from the image data (B) to thereby produce an artery image at 404. If the operator requires not only a vein image but also an artery image as the output images, the MRI system performs the MIP processing at 410 on the artery image (D) obtained at 404, so that an artery MIP image is output at 414. Furthermore, as depicted in FIG. 4, the process control is separate to 408 in accordance with operator selection, where the artery image (D) is subtracted from the image data (A) to produce a vein image (E). Thereafter, the MRI system performs the MIP processing at 412 on the vein image (E) obtained at 408, so that a vein MIP image is output at 416. In this way, the MRI system outputs both the artery image and the vein image.

In any event, MIP processing is performed at 410 and 412 to produce final output artery and vein MIP images D and E, respectively, at 414 and 416. As with the earlier embodiments, these final output images may be output to display, to non-transitory digital storage media or exported outside the originating MRI system.

According to the magnetic resonance imaging apparatus and a magnetic resonance imaging method of at least one embodiment described above, it becomes possible to effectively acquire vein images.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
   a scan performing unit configured to sequentially perform plural types of scans to acquire image data of images at a target region in a patient in a predetermined sequence, the scans including a first scan to acquire image data in a first phase encoding direction during diastole in the patient, a second scan to acquire image data in a second phase encoding direction approximately orthogonal to the first phase encoding direction during diastole in the patient, and a third scan to acquire image data in the second phase encoding direction during systole in the patient; and
   an image processing unit configured to perform predetermined image processing on plural image data sets acquired by the plural types of scans after the scan performing unit completes the first scan, the second scan, and the third scan.

2. The magnetic resonance imaging apparatus according to claim 1, wherein
   the scan performing unit sequentially performs the first scan, the second scan, and the third scan in the predetermined sequence such that completion of a preceding scan triggers a start of a following scan in the predetermined sequence.

3. The magnetic resonance imaging apparatus according to claim 1, wherein
   the image processing unit performs a first subtraction between the image data acquired by the second scan and the image data acquired by the third scan, and a second subtraction between the image data acquired by the first scan and image data obtained by the first subtraction.

4. The magnetic resonance imaging apparatus according to claim 3, wherein the image processing unit additionally performs maximum intensity projection (MIP) processing as the predetermined image processing.

5. The magnetic resonance imaging apparatus according to claim 1, wherein
the scan performing unit sequentially performs at least the first scan and the second scan, each of which being an image data acquisition scan during diastole in the patient, in the predetermined sequence.

6. The magnetic resonance imaging apparatus according to claim 1, further comprising:
a receiving unit configured to receive operator input of a parameter that the scan performing unit needs when the scan performing unit performs the plural types of scans and a parameter that the image processing unit needs when the image processing unit generates an output image, wherein
the scan performing unit sequentially performs the plural types of scans in accordance with the parameter received by the receiving unit, and
the image processing unit performs the image processing in accordance with the parameter received by the receiving unit.

7. The magnetic resonance imaging apparatus according to claim 1, wherein
the scan performing unit sequentially performs scans other than the first scan, the second scan, and the third scan, in addition to sequential execution of the first scan, the second scan, and the third scan.

8. A magnetic resonance imaging apparatus comprising:
a transmitter configured to transmit a resonance frequency pulse; and
a scan performing unit configured to sequentially perform plural types of scans to acquire image data of images at a target region in a patient in a predetermined sequence, the scans including a first scan to acquire image data in a first phase encoding direction during diastole in the patient, a second scan to acquire image data in a second phase encoding direction approximately orthogonal to the first phase encoding direction during diastole in the patient, and a third scan to acquire image data in the second phase encoding direction during systole in the patient.

9. A magnetic resonance imaging method implemented by a magnetic resonance imaging apparatus, comprising:
controlling, using a processor, sequentially plural types of scans to acquire image data of images at a target region in a patient in a predetermined sequence, the scans including a first scan to acquire image data in a first phase encoding direction during diastole in the patient, a second scan to acquire image data in a second phase encoding direction approximately orthogonal to the first phase encoding direction during diastole in the patient, and a third scan to acquire image data in the second phase encoding direction during systole in the patient; and
performing, using a processor, predetermined image processing on plural image data sets acquired by the plural types of scans after the first scan, the second scan, and the third scan are completed at the scanning step.

10. The magnetic resonance imaging method according to claim 9, wherein
the controlling includes sequentially controlling the first scan, the second scan, and the third scan in the predetermined sequence such that completion of a preceding scan triggers a start of a following scan in the predetermined sequence.

11. The magnetic resonance imaging method according to claim 9, wherein
the performing includes performing a first subtraction between the image data acquired by the second scan and the image data acquired by the third scan, and a second subtraction between the image data acquired by the first scan and image data obtained by the first subtraction.

12. The magnetic resonance imaging method according to claim 11, wherein
the performing includes additionally performing maximum intensity projection (MIP) processing as the predetermined image processing.

13. The magnetic resonance imaging method according to claim 9, wherein
the controlling includes sequentially controlling at least the first scan and the second scan, each of which being an image data acquisition scan during diastole in the patient, in the predetermined sequence.

14. The magnetic resonance imaging method according to claim 9, further comprising:
a receiving, using a processor, operator input of a parameter needed in the controlling and in the performing, wherein
the controlling includes sequentially controlling the plural types of scans in accordance with the parameter received by the receiving, and
the performing includes performing the image processing in accordance with the parameter received by the receiving.

15. The magnetic resonance imaging method according to claim 9, wherein
the controlling includes sequentially controlling scans other than the first scan, the second scan, and the third scan, in addition to sequential execution of the first scan, the second scan, and the third scan.

16. A magnetic resonance imaging method implemented by a magnetic resonance imaging apparatus, comprising:
transmitting, using a processor, a resonance frequency pulse; and
controlling, using a processor, plural types of scans to acquire image data of images at a target region in a patient in a predetermined sequence, the scans including a first scan to acquire image data in a first phase encoding direction during diastole in the patient, a second scan to acquire image data in a second phase encoding direction approximately orthogonal to the first phase encoding direction during diastole in the patient, and a third scan to acquire image data in the second phase encoding direction during systole in the patient.

* * * * *